United States Patent
Kanayama et al.

(10) Patent No.: US 6,512,491 B2
(45) Date of Patent: Jan. 28, 2003

(54) ANTENNA DEVICE AND ITS ASSEMBLY METHOD AND WIRELESS COMMUNICATION TERMINAL AND THEIR ASSEMBLY METHOD

(75) Inventors: Yoshiki Kanayama, Saitama (JP); Yuichiro Saito, Chiba (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/781,848

(22) Filed: Feb. 12, 2001

(65) Prior Publication Data

US 2001/0050647 A1 Dec. 13, 2001

(30) Foreign Application Priority Data

Feb. 14, 2000 (JP) ........................................ 2000-039810

(51) Int. Cl.[7] .............................. H01Q 1/10; H01Q 1/42
(52) U.S. Cl. ......................... 343/883; 343/702; 343/872
(58) Field of Search .................................. 343/883, 702, 343/872, 901, 906, 900, 715, 895, 700 MS; 439/916, 82, 743, 840; 455/90, 129, 575, 343, 439

(56) References Cited

U.S. PATENT DOCUMENTS

| | | | | |
|---|---|---|---|---|
| 3,946,390 A | * | 3/1976 | Alexander et al. | 343/702 |
| 4,090,030 A | * | 5/1978 | Lagasse | 174/153 A |
| 4,286,335 A | * | 8/1981 | Eichler et al. | 455/89 |
| 5,467,097 A | * | 11/1995 | Toko | 343/702 |
| 5,742,259 A | * | 4/1998 | Annamaa | 343/895 |
| 5,832,372 A | * | 11/1998 | Clelland et al. | 455/115 |
| 5,907,817 A | * | 5/1999 | Mendolia | 455/575 |
| 6,198,444 B1 | * | 3/2001 | Sailsman et al. | 343/702 |
| 6,259,410 B1 | * | 7/2001 | Chang | 343/702 |
| 6,271,794 B1 | * | 8/2001 | Geeraert | 343/700 MS |
| 6,337,663 B1 | * | 1/2002 | Chi-Ming | 343/702 |

* cited by examiner

*Primary Examiner*—Don Wong
*Assistant Examiner*—Trinh Vo Dinh
(74) *Attorney, Agent, or Firm*—Frommer Lawrence & Haug LP; William S. Frommer; Matthew K. Ryan

(57) ABSTRACT

In an antenna device and its assembly method as well as a wireless communication terminal and its assembly method, an antenna element is held in an antenna holding member. A circuit board formed with an electrode to supply power to the antenna element is held on a board holding member. The antenna element and the electrode of the circuit board are electrically connected each other by means of a connection member having elasticity by fixing the antenna holding member on the board holding member. This enables the antenna holding member to be fixed on the board holding member easily because the antenna element is held in the antenna holding member in advance, and concurrently the antenna element can be electrically connected to the electrode of the circuit board by means of the connection member by merely fixing the antenna holding member on the board holding member, thus markedly enhancing the assembly of the antenna devices and wireless communication terminal units.

32 Claims, 13 Drawing Sheets

ANTENNA DEVICE AND ITS ASSEMBLY METHOD AND WIRELESS COMMUNICATION TERMINAL AND THEIR ASSEMBLY METHOD

BACKGROUND OF THE INVENTION

1. Field of the Invention

The present invention relates to antenna device and its assembly method as well as wireless communication terminal and its assembly method, and more particularly, is suitably applied to wireless communication terminals to realize a network by wireless by connecting a variety of electronic equipment one another for example.

2. Description of the Related Art

There has been Local Area Network (LAN), a conventional network configured by connecting various electronic equipment to one another such as personal computers and printers, which are used within an architecture or on the premises.

Various electronic devices are usually connected one another in such a LAN system by means of a dedicated communication cable. However, to dissolve complexity in routing the communication cable connecting such electronic devices, of late there:are cases where a wireless communication terminal is connected to each electronic device, thereby realizing wireless communication among those wireless communication terminals.

As shown in FIG. 1, a wireless communication terminal 1 houses inside its housing case 2 made of a nonconductive material, for example, various circuit elements forming transmitting/receiving circuits and a matching circuit, a circuit board 4 mounted with an antenna element 3 produced of a bar-shaped conductive material as well as a shield 5 case made of a conductive material covering various circuit elements on circuit board 4.

Practically, as shown in FIGS. 2 and 3, formed on a surface 4A of circuit board 4 are an electrode 6A (called "feeding point rand" hereinafter) to feed power to an antenna element 3 by means of a conductive pattern, and a wiring pattern 6B to electrically connect feeding point rand 6A to a transmitting/receiving circuit 8 through a matching circuit 7.

Also, a stopper 3A, wider in diameter than antenna element itself 3, is formed at one end of antenna element 3, and a through hole 4B matching the girth of that end of antenna element 3 on circuit board 4 so that it may fit into feeding point rand. 6A.

With the one end inserted into through hole 4B causing stopper 3A to be implanted into surface 4A of circuit board 4, antenna element 3 is connected electrically and mechanically at stopper 3A area to feeding point 6B by means of solder 9.

Thus, wireless communication terminal 1 is designed such that it captures given transmit data supplied from an electric device (not shown in Fig.) into circuit board 4, which is transmitted from transmitting/receiving circuit 8 to other wireless communication terminals via matching circuit 7 and antenna element 3 in order, and such that it also receives data transmitted from other wireless communication terminals at transmitting/receiving circuit 8 through antenna element 3 and matching circuit 7 in order, which is transferred to proper electronic equipment.

For additional information, such a wireless communication terminal 1 is designed such that a shield case 5 inside housing case 2 functions as an electric shield preventing against external noises and electric waves radiated from antenna element 3 going around into various circuit elements in transmitting and receiving.

There has been a tendency that those such as wireless communication terminal 1 are made compact as circuit boards 4 are downsized thanks to the advancement of the mounting technology in recent years.

However, if a wireless communication terminal 1 is used in a bandwidth of about 2.4GHz in transmitting and receiving data for example, an antenna element 3 designed to an electric length of $\lambda/4$ requires a physical length of about 30 mm, and another antenna element 3 designed to an electric length of $\lambda/2$, a physical length of about 60 mm.

Because of the above, as is apparent from FIG. 1, in a wireless communication terminal 1 a projection 10 is formed on housing case 2, with the other end of antenna element 3 housed in projection 10.

In practice, in such a wireless communication terminal 1 housing case 2 is made up of a case half, bottom 2A, and a case half, top 2B formed with projection 10. And, when assembled, the circuit board 4 mounted with the shield case 5 is placed on the bottom 2AX; of the case half, bottom 2A by means of legs (not shown in Fig.), and then the case half, top 2B, is placed over the case half, bottom 2A.

However, in assembling the wireless communication terminal 1 a worker holding the case half, top 2B can not see the antenna element 3 because of the case half, top 2B being a cover, making it hard to;have the other end of the antenna element 3 housed into the projection 10 and to mount the case half, top 2B, on the case half, bottom 2A, resulting in poor assemblage.

In order to solve such a problem, as FIG. 4 shows, it can be thought for a wireless communication terminal 14 to house a circuit board 17 with a shield case 16 attached into the housing case 15 consisting of a case half, bottom 15A, and a case half, top 15B, and to hold an antenna element 19 in a nonconductive antenna holding member 18 implanted in a through hole 15BX formed on case half, top 15B, with a male connector (called "male connector" hereinafter) 21 electrically connected to antenna element 19 by means of a coaxial cable 20 capable of forming into any shape, electrically and mechanically connected to a female connector (called "female connector" hereinafter) 22 mounted on circuit board 17.

As shown in FIG. 5, in assembling wireless communication terminal 14 thus constructed, circuit board 17 mounted with shield case 16 is placed on a bottom 15AX of case half, bottom 15B by means of legs (not shown in Fig.), and antenna holding member 18 housing antenna element 19 is inserted into through hole 15BX of case half, top 15B. Then, with male connector 21 connected electrically and mechanically to female connector 22, case half, top 15B is placed over case half, bottom 15A in a overlapping manner, so that case half, top 15B is easily fixed on case half, bottom 15A because antenna element 19 is housed in antenna holding member 18 in advance.

However, in wireless communication terminal 14 thus constructed, because a coaxial cable 21 connected with antenna element 19 is connected to female connector 22 on circuit board 17 by means of male connector 21 before case half, top 15B is fixed on case half, bottom 15A, coaxial cable 21 comparatively long must be used considering the work to fix case half, top 15B on case half, bottom 15A.

Due to the above, care must be taken in assembling wireless communication terminal 14 in a way that coaxial cable 21 is bent in a given shape so that it would not protrude between case half, bottom 15A and case half, top 15B when mounting case half, top 15B on case half, bottom 15A, which still remains unsolved as a problem.

SUMMARY OF THE INVENTION

In view of the foregoing, an object of this invention is to provide an antenna device and its assembling method as well as a wireless communication terminal and its assembling method, with a markedly enhanced assemblage.

The foregoing object and other objects of the invention have been achieved by the provision of an antenna device and a wireless communication terminal. An antenna element is held by an antenna holding member, and a circuit board formed with an. electrode to feed power into the antenna element is held by the board holding member, and the antenna element and the electrode of the circuit board are electrically connected by means of a resilient connecting member by fixing the antenna holding member on the board holding member.

Accordingly, because the antenna element is supported by the antenna holding member in advance it is easy to fix the antenna holding member on the board holding member, enabling the antenna element to be electrically connected to the electrode of the circuit board member of the connecting member by merely mounting the antenna holding member onto the board holding member.

The nature, principle and utility of the invention will become more apparent from the following detailed description when read in conjunction with the accompanying drawings in which like parts are designated by like reference numerals or characters.

DETAILED DESCRIPTION OF THE EMBODIMENT

Preferred embodiments of this invention will be described with reference to the accompanying drawings:

(1) First Mode of Embodiment

Figure 6:
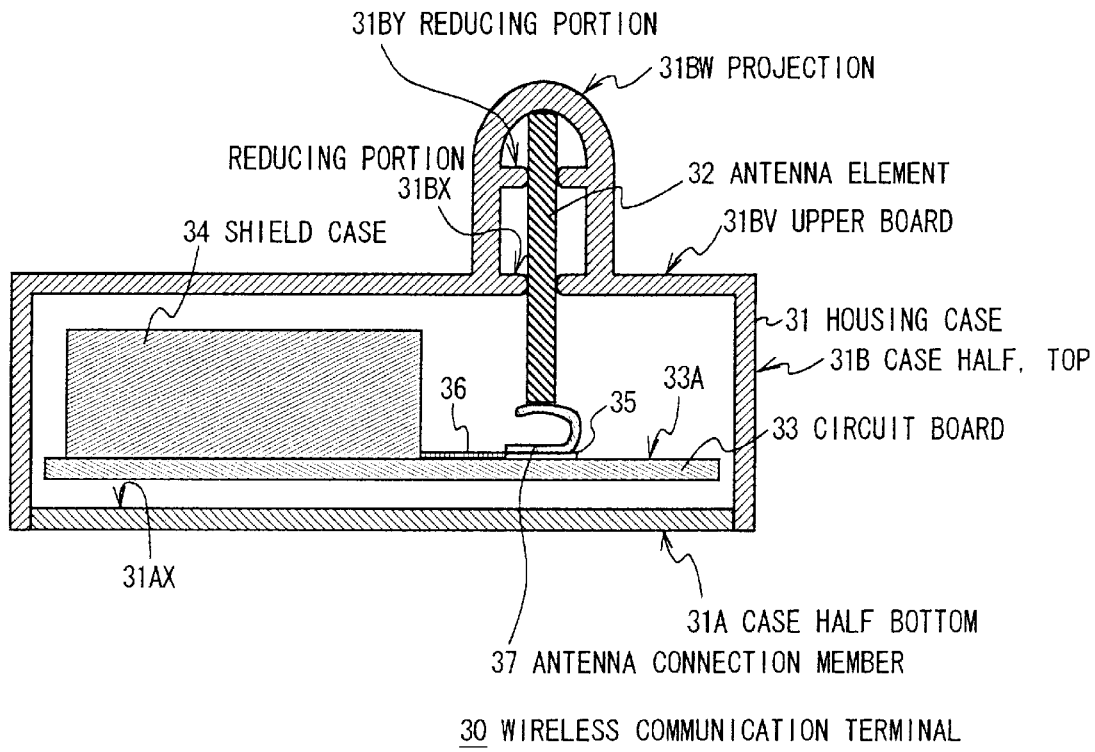
FIG. 6 is a schematic cross sectional view of the present invention showing the architecture of a wireless communication terminal in a first mode of embodiment.

The number 30 in FIG. 6 shows the whole of a wireless communication terminal in a first mode of embodiment, where an antenna element 32 produced of a bar-shaped conductive member, circuit board 33 installed with various circuit elements such as a transmitting/receiving (TR) circuit and a matching circuit, and a shield case 34 produced of a conductive member covering such various circuit elements are housed inside a box-type housing case 31 made of a nonconductive member.

Housing case 31 consists of a case half, bottom 31A, and a case half, top 31B to be put on case half, bottom 31A.

With circuit board 33 fixed with shield case 34 located by means of legs (not shown in Fig.) case half, bottom 31A holds circuit board 33.

Then, on a surface 33A of circuit board 33 are formed a feeding point rand 35 in a given position in a form of a conductive: pattern, and a wiring pattern 36 electrically connecting feeding point rand 35 to TR circuit (not shown in Fig.) by means of a matching circuit (not shown in Fig.).

Also, feeding point rand 35 is installed, by the application of solder, with an antenna connection member 37 of a plate spring produced of a conductive plate such as a phosphoric copper, bent into a rough U shape by such a method as a pressing process.

Meanwhile, a cylindrical projection 31BW is placed on a upper board 31BV of case half, top 31B, facing towards an antenna connection member 37 mounted on circuit board 33 held onto case half, bottom 31A.

Formed inside projection 31BW are reduced portions 31BX and 31BY in a narrower internal diameter in two stages, into which one end of antenna element 32 is so inserted in place that antenna element 32 may not move up and down.

With the other end held onto, or connected electrically, to antenna connection member 37 in this way, antenna element 32 is connected to feeding point rand 35 on circuit board 33 by means of antenna connection member 37, and TR circuit electrically via wiring pattern 36 and matching circuit in this order.

Thus, various electronic devices are connected to wireless communication terminal 30 via a specified cable (not shown in Fig.), which captures given transmit data supplied from those electronic devices (not shown in figure) into its circuit board 33, which is in turn transmitted from its TR circuit to other wireless communication terminals through matching circuit, wiring pattern 36, feeding point rand 35, antenna connection member 37, and antenna element 32 in this order.

Also, wireless communication terminal 30 receives data transmitted from other wireless communication terminals at its TR circuit via antenna element 32, feeding point rand 35, wiring pattern 36, and matching circuit, which is in turn transferred to proper electronic equipment by means of the cable.

For additional information, with shield case 34 inside housing case 31 functioning as electrical shield plates in wireless communication terminal 30 in transmitting and receiving, external noises and waves radiated from antenna element 32 can be prevented from going around into various circuit elements on circuit board 33.

Figure 7A:
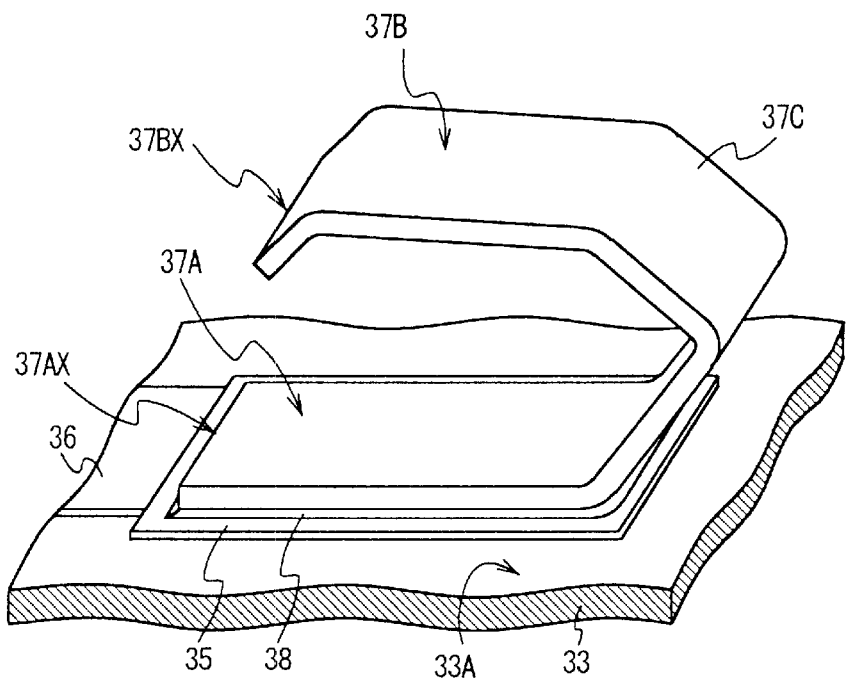
FIGS. 7A and 7B are schematic perspective view and schematic side elevation showing the architecture of an antenna connection member.
Figure 7B:
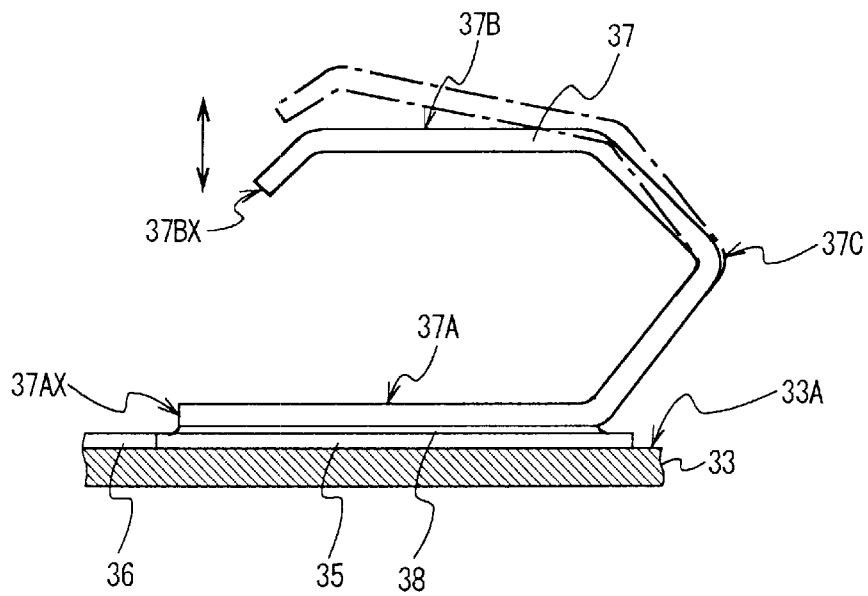

As shown in FIGS. 7A and 7B, in practice a lower flat portion 37A and upper flat portion 37B of antenna connection member 37 face each other, hooked with a bent portion 37C as the starting point, thereby being separated by a given distance.

Then, with upper flat portion 37B facing the end of the other side of antenna element 32, lower flat portion 37A of antenna connection member 37 is electrically and mechanically connected to feeding point rand 35 on circuit board 33 by means of solder 38.

Also, when upper flat portion 37B having resilience is depressed towards lower flat portion 37A with no external force applied to (this state is called "reference state" hereinafter), hooked portion 37C bends such that upper flat portion 37B approaches lower flat portion 37A by a given distance in accordance with a depressing force. However, it returns to the reference state by its resilience from a crooked state (this state is called "transformed state" hereinafter) due to the depressing force.

Figure 8:
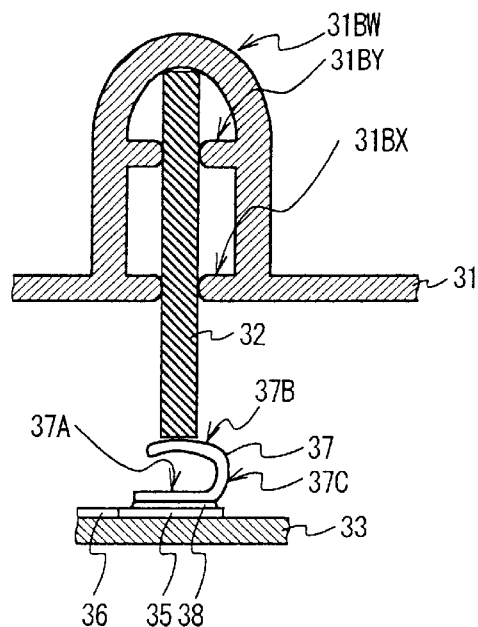
FIG. 8 is a schematic cross sectional view used in explaining the connection of an antenna element and antenna connection member.

On the other hand, as FIG. 8 shows, antenna element 32 having a given degree of hardness, and assuming that the wavelength of a frequency bandwidth used for transmit data and receive data is λ, it is adjusted to a given electric length of a bandwidth ranging from λ/4 to λ/2 for example.

Also, with one end of antenna element 32 pressed onto upper flat portion 37A of antenna connection member 37 in such a way as to bend antenna connection member 37 itself to the transformed state, the length to the other end projecting downwards from projection 31BW into the inside of housing case 31 (this is simply called "projection length" hereinafter) is properly determined, so that the other end of antenna element 32 is almost surely connected to upper flat portion 37B of antenna connection member 37.

Then, when antenna element 32 is pressed onto antenna connection member 37, the resilient energy works so as to return it from the transformed state to the reference state, applying an upward pressure to the end face of the other end of antenna element 32, thereby maintaining the stable connection between the end face of the other end of antenna element 32 and upper flat portion 37B of antenna connection member 37.

Figure 9:
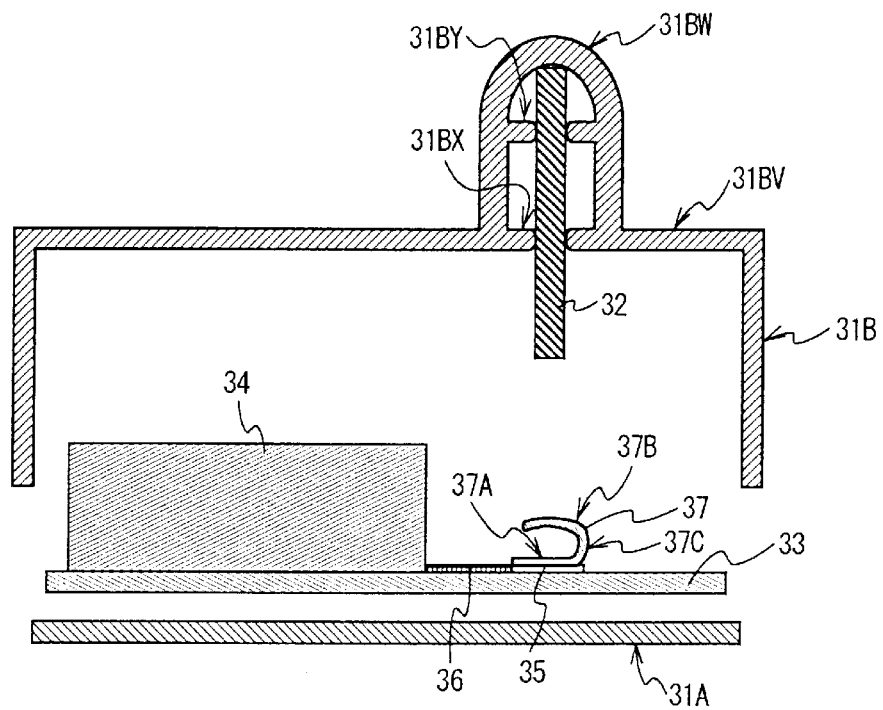
FIG. 9 is a schematic cross sectional view showing the assembly process of a wireless communication terminal.
Figure 10:
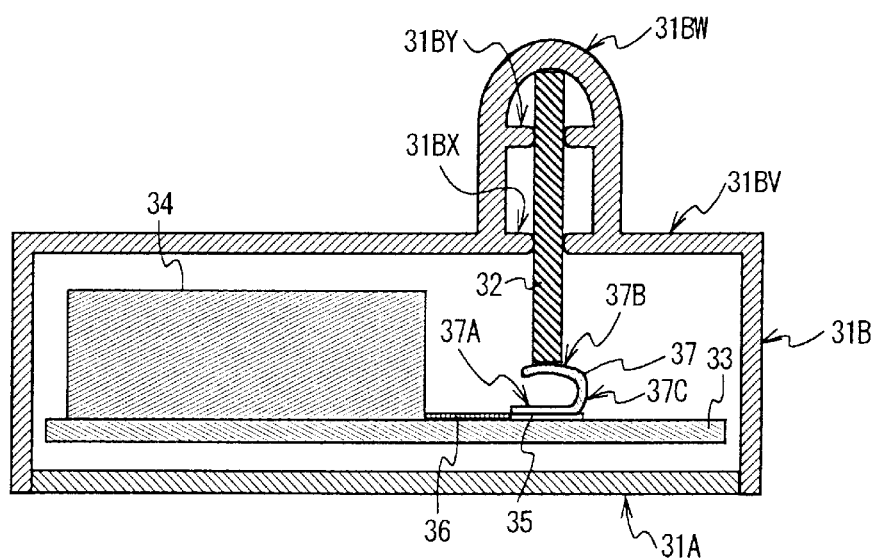
FIG. 10 is a schematic cross sectional view showing the assembly process of a wireless communication terminal.

Now, wireless communication terminal 30 can be assembled following the procedures shown in FIGS. 9 and 10.

That is, as shown in FIG. 9, with antenna element 32 fixed on projection 31BW of case half, top 31B, circuit board 33 mounted with shield case 34 is positioned to, and held on the surface of bottom 31AX of case half, bottom 31A in a way that the end face of the other end of antenna element 32 and upper flat portion 37B of antenna connection member 37 face each other when putting case half, top 31B on case half, bottom 31A.

Next, as shown in FIG. 10, the end face of the other end of antenna element 32 is electrically connected, pressed onto upper flat portion 37B of the antenna connection member 37 mounted with circuit board 33 by fixing case half, top 31B on case half, bottom 31A in a overlapping manner, thus electrically connecting antenna element 32 to feeding point rand 35 on circuit board 33 by means of antenna connection member 37. Now, wireless communication terminal 30 has been assembled.

Accordingly, with wireless communication terminal 30, because antenna element 32 is fixed on projection 31BW of case half, top 31B in advance it is easy to mount case half, top 31B onto case half, bottom 31A.

Also, in wireless communication terminal 30, since the circuit board 33 is fixed on the case half, bottom 31A, positioned against antenna element 32 held on case half, top 31B, the end face of the other end of antenna element 32 can be easily connected to feeding point rand 35 on circuit board 33 electrically by means of antenna connection member 37 by merely putting case half, top 31B on case half, bottom 31A.

Furthermore, in wireless communication terminal 30, with antenna connection member 37 produced of a plate spring, even if an error should occur in the projection length of antenna element 32 possibly caused by inappropriate installation of antenna element 32 into projection 31BX, if an error is within the range of from the projection length that the end face of the other end of antenna element 32 contacts upper flat portion 37B of antenna connection member 37 in the reference state, to the projection length that upper flat portion 37B is depressed towards lower flat portion 37A (this length is called the "specified range" hereinafter), an error in installation of antenna element 32 to projection 31BX will be absorbed by the resilience of antenna connection member 37.

Accordingly, in wireless communication terminal 30, should an error occur in projection length of antenna element 32, prevention is provided against the misconnection of antenna element 32 to feeding point rand 35 on circuit board 33, or against breakage possibly caused by an unnecessarily greater external pressure applied by the other end of antenna element 32 to circuit board 33 through antenna connection member 37.

Additionally, in wireless communication terminal 30 antenna connection member 37 works as an impact alleviating portion due to its resilience with respect to antenna element 32 when putting case half, top 31B on case half, bottom 31A, thus almost surely preventing against possible breakage of antenna element 32 being pressed against antenna connection member 37.

Also, in wireless communication terminal 30, with upper flat portion 37B of antenna connection member 37 designed to have a given area, if antenna element 32 is fixed in projection 31BW with an inclination in the upward and downward directions longitudinally, or if antenna connection member 37 is placed out of position against feeding point rand 35, upper flat portion 37B is almost surely connected electrically to the end face of the other end of antenna element 32.

For additional information, with a conventional wireless communication terminals 1 (FIG. 1) a worker can not see an antenna element 3 (FIG. 1) with a case half, top 2B being an obstacle when putting a case half, bottom 2B on case half, top 2A, so that there have been such cases that antenna element 3 breaks with upper board (in the vicinity of the foot of projection 10 (FIG. 1)) of case half, top 2B being pressed to the other end of antenna element 3.

Against this, in a wireless communication terminal 31, since antenna element 32 is fixed in advance in projection 31BW of case half, top 31B in assembling (in manufacture and maintenance), antenna element 32 is almost surely prevented from being broken by case half, top 31B.

In wireless communication terminal 30 thus constructed, housing 31 consisting of case half, bottom 31A and case half, top 31B, antenna element 32 is fixed on the projection 31BW of case half, top 31B when assembled.

Also, circuit board 33 is positioned against and fixed on case half, bottom 31A with upper flat portion 37B of antenna connection member 37 electrically and mechanically connected to feeding point rand 35 facing the end face of the other end of antenna element 32 supported by case half, top 31B.

Then, when case half, top 31B, is put on case half, bottom 31A in a overlapping manner, the end face of the other end of antenna element 32 is electrically connected to feeding point rand 35 on circuit board 33 by means of antenna connection member 37.

Accordingly, in wireless communication terminal 30, because antenna element 32 is held in projection 31BW of case half, top 31B in advance, obviating the difficulty attendant upon a conventional wireless communication terminal device 1 (FIG. 1) when housing antenna element 3 (FIG. 1) into projection 10 (FIG. 1) of case half, top 2B, case half, top 31B can be easily fixed on case half, bottom 31A.

Also, in wireless communication terminal 30, when fixing case half, top 31B on case half, bottom, 31A, circuit board 33 is positioned against and fixed on case half, bottom 31A so that the end face of the other end of antenna element 32 is pressed onto antenna connection member 37, antenna element 32 can be easily connected to feeding point rand 35 electrically by means of antenna connection member 37 by merely putting case half, top 31B on case half, bottom 31A, almost surely preventing against poor connection and breakage.

Figure 4:
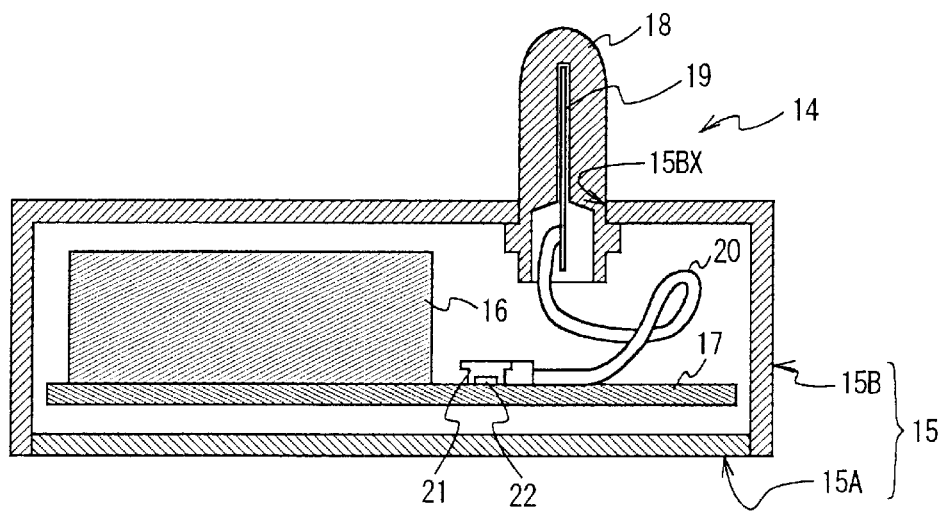
FIG. 4 is a schematic cross sectional view showing another architecture of a conventional wireless communication terminal.
Figure 5:
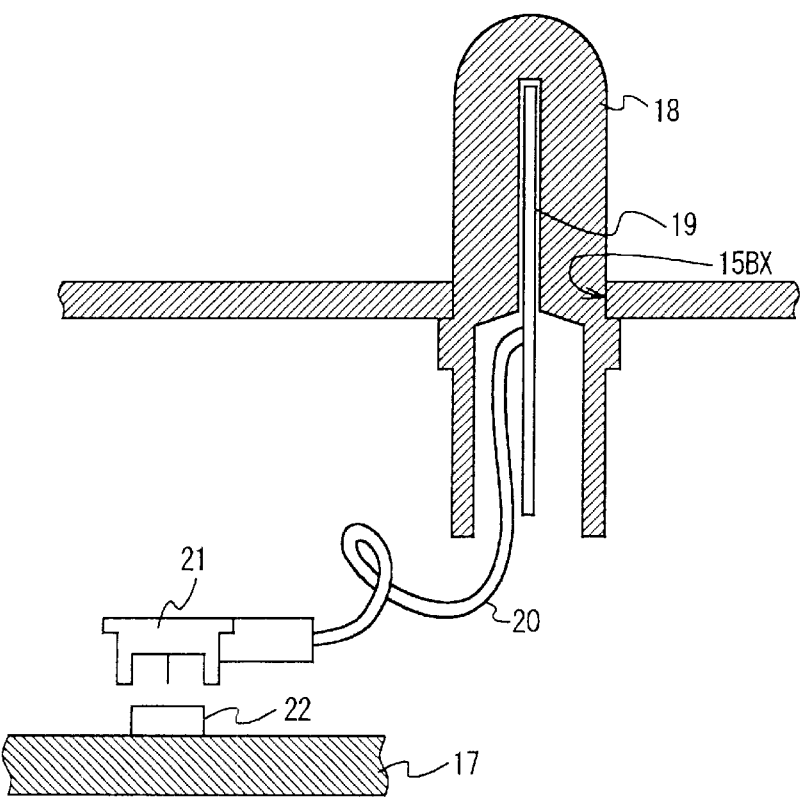
FIG. 5 is a schematic cross sectional view used in explaining the connection of an antenna element to a circuit board.

For a conventional wireless communication terminal 14 (FIG. 4) it is necessary to use a coaxial cable 20 (FIG. 4) comparatively longer than a given length needed to feed power to antenna element 19 (FIG. 4) when putting case half, top 15B (FIG. 4) on case half, bottom 15A (FIG. 4) in consideration of the installation workability.

Due to the above, in wireless communication terminal 14 it is feared in transmitting and receiving less transmission loss of data might increase in coaxial cable 20, deteriorating the quality of transmit data and receive data due to coaxial cable 20.

Against the above, in wireless communication terminal 30, because antenna element 32 and feeding point rand 35 on circuit board 33 are electrically connected to each other with the use of antenna connection 37 with a greatly reduced transmission loss due to a markedly shorter physical length compared to coaxial cable 20 used for conventional wireless communication terminal 14, it is almost surely possible to prevent against the deterioration of transmitted data and receive data conveyed through the antenna connection member 37.

Figure 1:
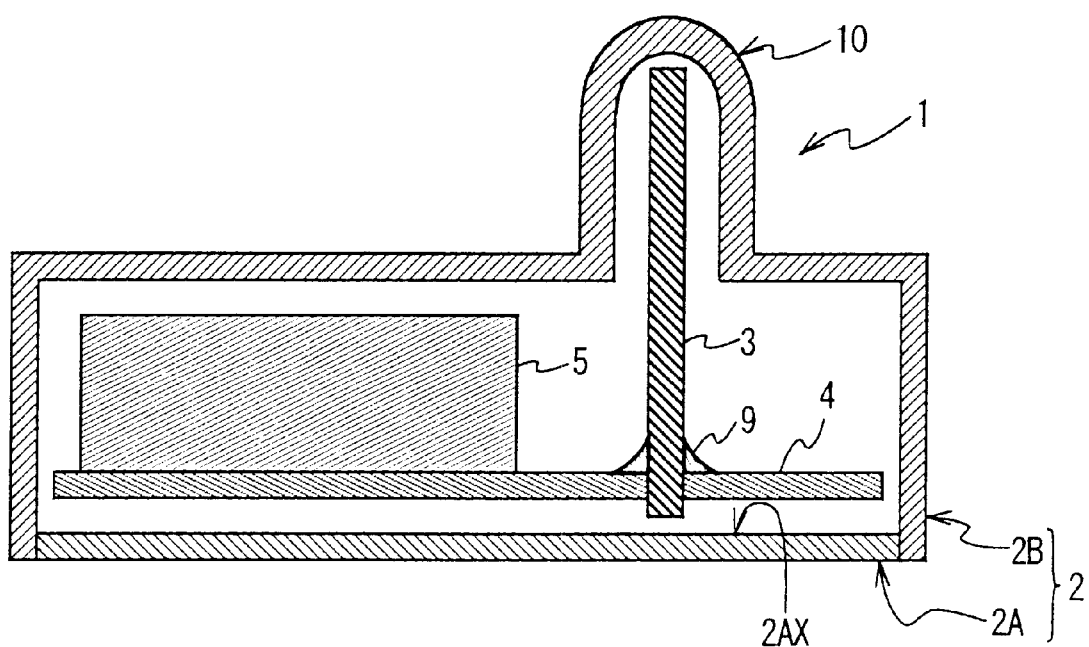
FIG. 1 is a schematic cross sectional view showing the architecture of a conventional wireless communication terminal.
Figure 2:
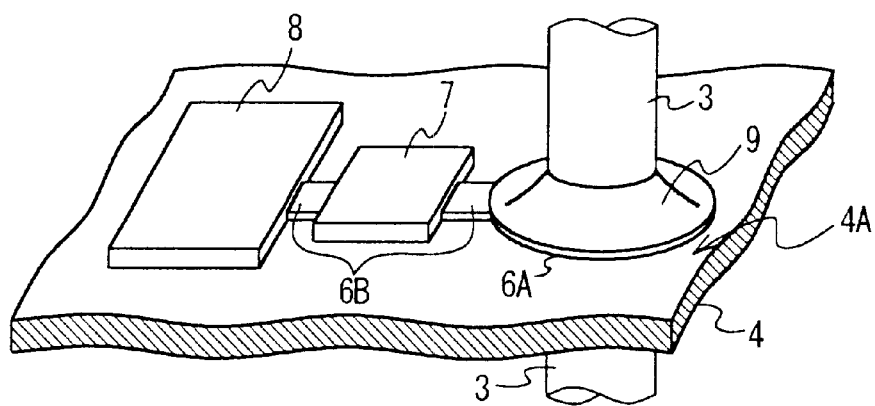
FIG. 2 is a schematic perspective view used in explaining the connection of an antenna elements and various circuit elements.
Figure 3:
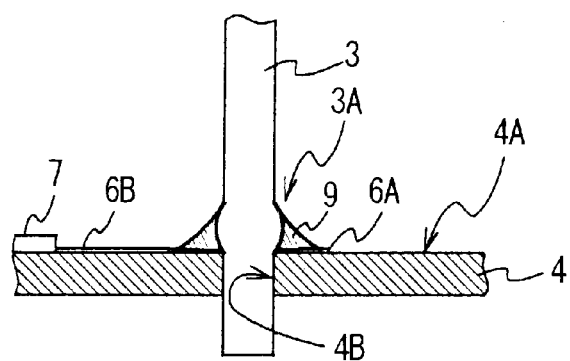
FIG. 3 is a schematic cross sectional view used in explaining the mounting of an antenna element onto a circuit board.

Also, in conventional wireless communication terminal 1 (FIG. 1) the mounting of antenna element 3 (FIG. 1) must be done manually because antenna element 3 is installed by inserting it into through hole 4B (FIG. 1) of circuit board 4 (FIG. 1). Against it, with wireless communication terminal 30 because of antenna connection member 37 capable of installing case half, top 31B holding antenna element 32 on circuit board 33, antenna connection member 37 can be mounted on circuit board 33, together with a variety of other circuit elements using a given mounting machine, resulting in the simplification of mounting work on circuit board 33.

According to the above construction, with antenna element 32 held in projection 31BW of case half, top 31B, and circuit board 33 positioned against and fixed on case half, bottom 31A in such a way as to let the plate-spring antenna connection member 37 connected electrically and mechanically to feeding point rand 35 face the end face of the other end of antenna element 32, so that it is easy to fix case half, top 31B on case half, bottom 31A. Simultaneously the end face of the other end of antenna element 32 can be easily connected to feeding point rand 35 on circuit board 33 by means of antenna connection member 37, thus succeeding in the realization of a wireless communication terminal with substantially enhanced assemblage.

(2) Second Mode of Embodiment

Figure 11:
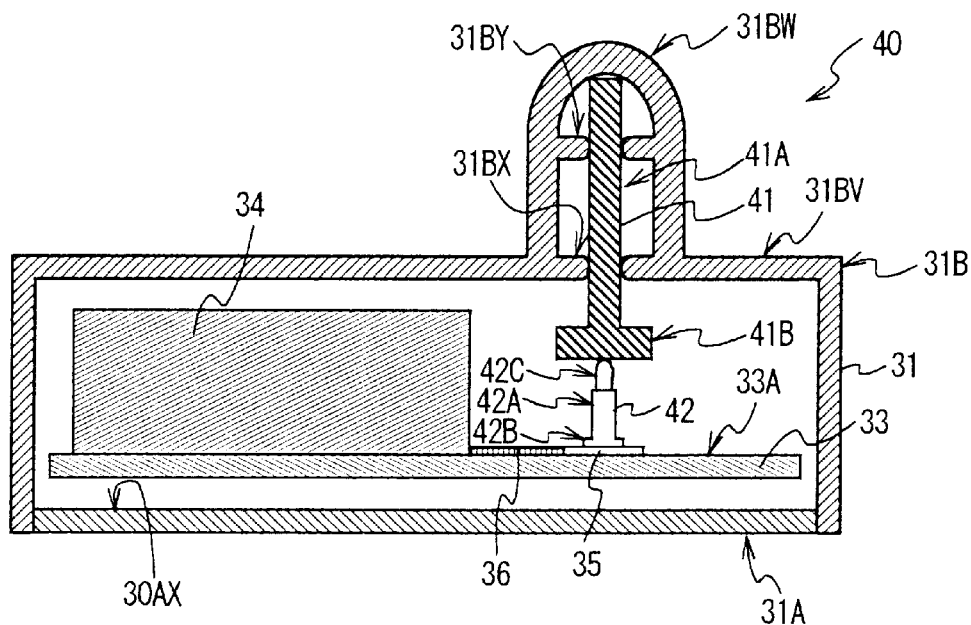
FIG. 11 is a schematic cross sectional view showing the architecture of a wireless communication terminal in a second mode of embodiment.

FIG. 11 showing the same numeral references corresponding to those in FIG. 6 shows a wireless communication terminal 40 in a second mode of embodiment, which is constructed similarly to wireless communication terminal 30 in the first mode of embodiment, except for the construction of an antenna element 41 and antenna connection member 42.

Antenna element 41 has a conductive flange portion 41B around it at one end of a conductive bar portion 41A having a given degree of hardness, with the other end of bar portion 41A supported by projection 31BW of a case half, top 31B.

Figure 12:
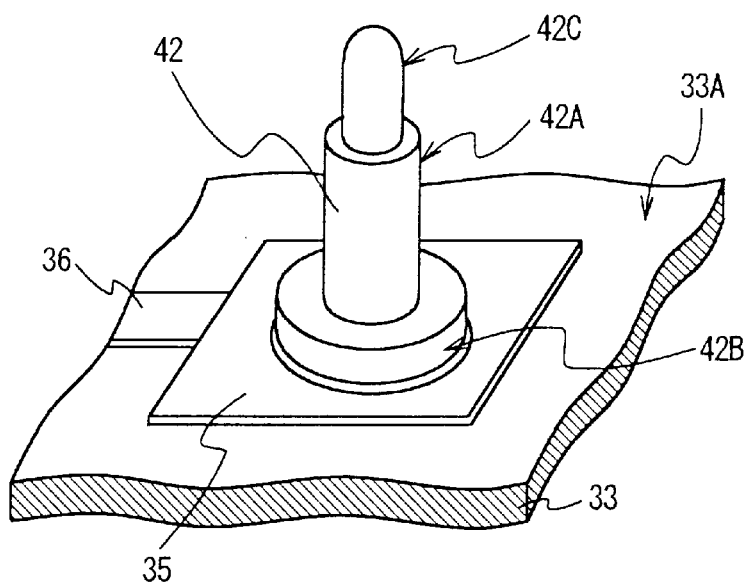
FIG. 12 is a schematic perspective view showing the architecture of an antenna connection member.

As shown in FIG. 12, antenna connection member 42 has a conductive flange portion 42B around it at one end of a conductive cylinder 42A in a way to occlude the cylinder itself, with a conductive pin 42C inserted into cylinder 42A in a free-sliding way, along its longitudinal direction at the other end of cylinder 42A.

Then, antenna connection member 42 is mounted on circuit board 33, with flange portion 42B electrically and mechanically connected to feeding point rand 35 on circuit board 33 by means of solder.

Figures 13A, 13B:
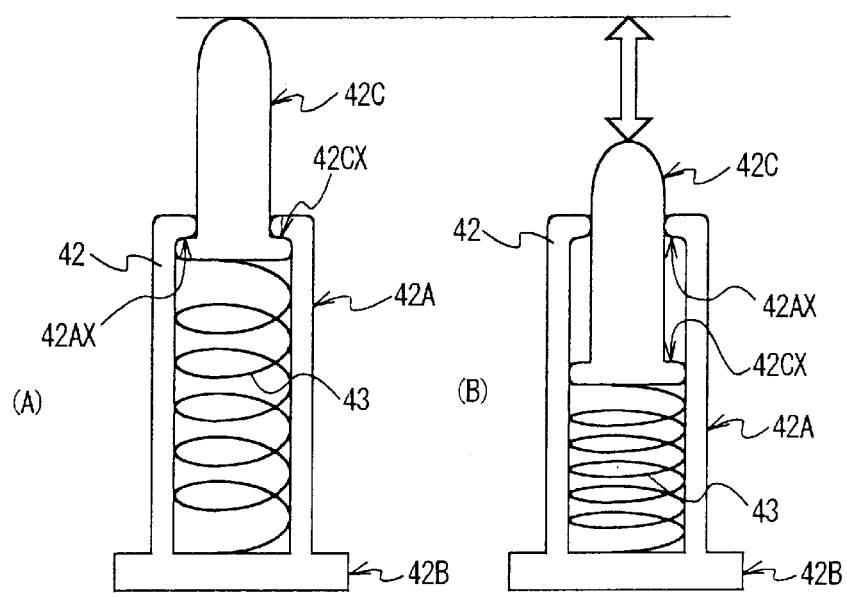
FIGS. 13A and 13B are schematic cross sectional views used in explaining the telescopic movement of an antenna connection member.

In practice, as shown in FIGS. 13A and 13B, antenna connection member 42 houses a coil spring 43 therein, of which natural length is determined in a way that the whole of antenna connection member 42 extends to its longest or the reference state, when an external pressure is not applied to pin 42C, causing a flange portion 42CX formed at the foot of pin 42C to hit a contracted portion 42AX formed at the other end of cylinder 42A.

Also, since depressing downwards the tip of pin 42C causes coil spring 43 to contract accordingly, the whole of antenna connection member 42 is brought into a contracted state (this is called the "contracted state" hereinafter), concurrently with coil spring 43 returning from the contracted state to the reference state by its resilience. 11) pressed onto, or electrically connected to pin 42C of antenna connection member 42, antenna element 41 is electrically connected to feeding point rand 35 on circuit board 33 by means of antenna connection member 42.

The projection length of antenna element 41 projecting from projection 31BW to the inside of housing case 31 is properly determined so that antenna connection member 42 contracts with the end face of flange portion 41B pressed to pin 42C of antenna connection member 42, thus ensuring the connection of antenna element 41 to antenna connection member 42.

As regards antenna connection member 42, when antenna element 41 is pressed against it, the resilient energy works so as to return coil spring 43 from the contract state to the reference state, thereby applying an upward pressure to the end face of flange portion 41B of antenna element 41, resulting in the stable maintenance of the connection of the end face of flange portion 41B of antenna element 41 and pin 42C of antenna connection member 42.

Figure 14:
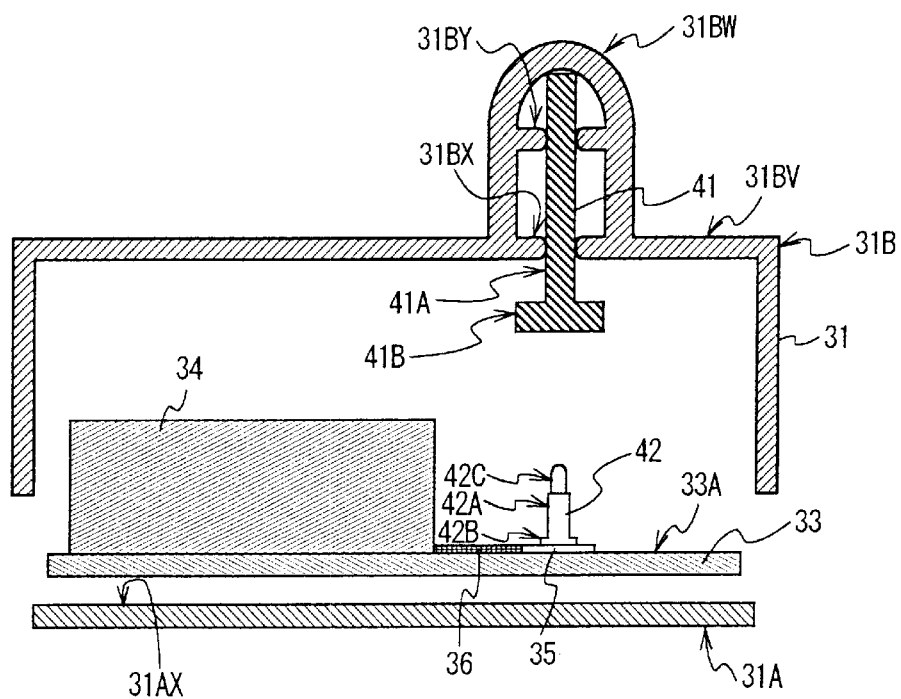
FIG. 14 is a schematic cross sectional view showing the assembly process of a wireless communication terminal.
Figure 15:
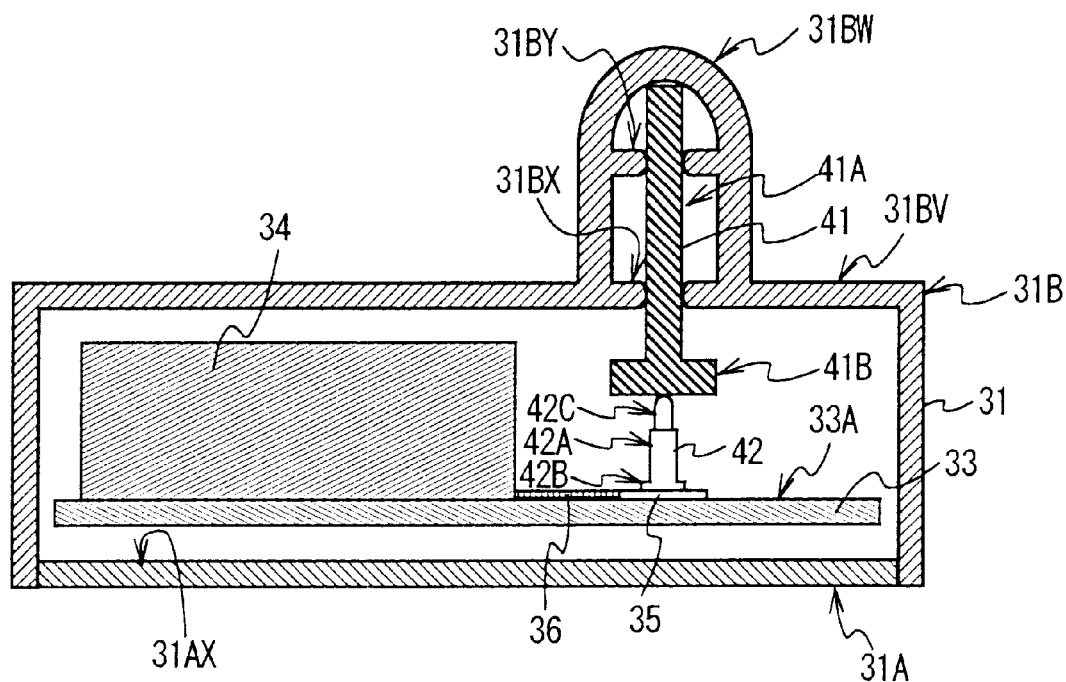
FIG. 15 is a schematic cross sectional view showing the assembly process of a wireless communication terminal.

Now, wireless communication terminal 40 can be assembled following the procedures shown in FIGS. 14 and 15.

As show in FIG. 14, with antenna element 41 held in projection 31 BW of case half, top 31B, circuit board 33 fixed with shield case 34 should be positioned against and held onto bottom surface 31AX of case half, bottom 31A with the end of flange portion 41B of antenna element 41 and pin 42C of antenna connection member 42 facing each other when putting case half, top 31B on case half, bottom 31A.

Next, as shown in FIG. 15, the end face of flange portion 41B of antenna element 41 is pressed onto and electrically connected to pin 42C of antenna connection member 42 mounted on circuit board 33 by putting case half, top 31B on case half, bottom 31A in a overlapping way, thus electrically connecting antenna element 41 and feeding point rand 35 of circuit board 33 by means of antenna connection member 42, completing the assembly of wireless communication terminal 40.

Accordingly, in wireless communication terminal 40, because antenna element 41 is held in projection 31BW of case half, top 31B in advance, it is easy to put case half, top 31B on case half, bottom 31A in a overlapping way. Concurrently, since circuit board 33 is held on case half, bottom 31A, with antenna element 41 and antenna connection member 42 positioned to face each other, it is easy to electrically connect antenna element 41 to feeding point rand 35 on circuit board 33 by means of antenna connection member 42 by merely fixing case half, top 31B on case half, bottom 31A.

Figure 19:
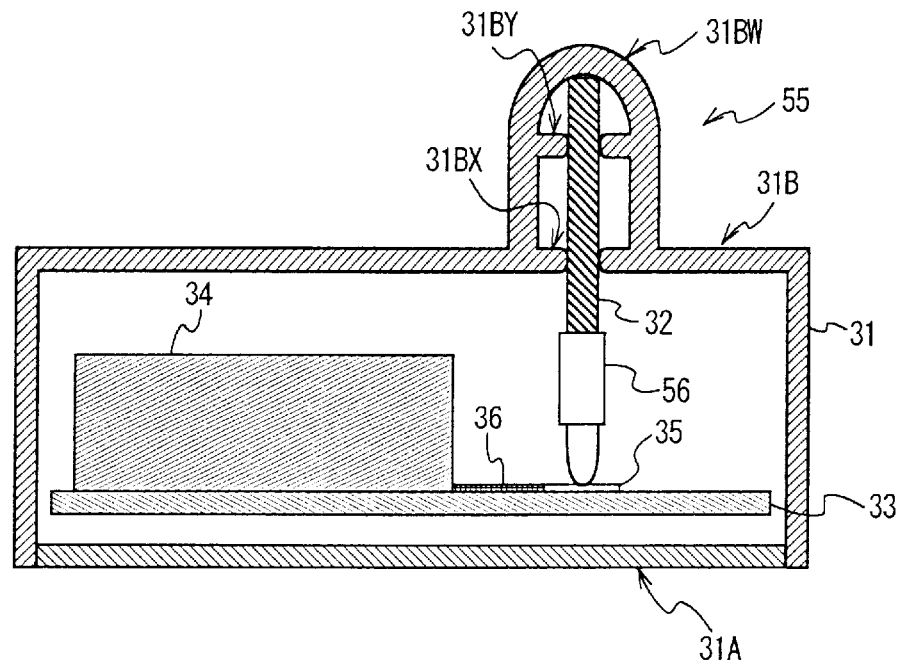
FIG. 19 is a schematic cross sectional view used in explaining an antenna element connected with an antenna connection member in another embodiment.

For additional information, in wireless communication terminal 40, as in wireless communication terminal 30 (FIG. 19) of the aforementioned first mode of embodiment, because antenna element 411 and feeding point rand 35 on circuit board 33 are electrically connected with the use of antenna connection member In wireless communication unit 40, with antenna connection member 42 being movable telescopically, should an error occur in the projection length of antenna element 41 in relation to projection 31BX due to a mis-installation and other causes, an error in installation of antenna element 41 may be absorbed by antenna connection member 42, if the error occurred in the projected length remains within the range of from the length that the end of flange portion 41B of antenna element 41 contacts tip of pin 42C of antenna connection member 42 in the reference state, to the projected length of antenna element 41 with antenna connection member 42 most contracted in the specified range.

Accordingly, in wireless communication terminal 40, should an error occur in the projection length of antenna element 41 within the:predetermined range, prevention is provided against the misconnection of antenna element 41 to feeding point rand 35 on circuit board 33, or against breakage possibly caused by an unnecessarily greater external pressure applied by flange portion 41B of antenna element 41 to circuit board 33 through antenna connection member 42.

Also, in communication wireless terminal 40, antenna connection member 42 works as an impact alleviating portion due to its resilience with respect to antenna element 41 when putting case half, top 31B on case half, bottom 31A, thus almost surely preventing against possible breakage of antenna element 41 being pressed against antenna connection member 42.

Figure 16:
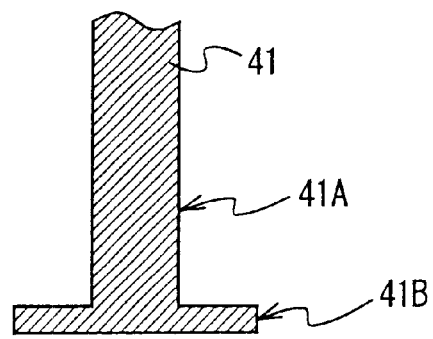
FIG. 16 is a schematic cross sectional view used in explaining the flange portion of an antenna element.

Furthermore, in wireless communication terminal 40, as shown in FIG. 16, by means of forming a flange portion having a given area on antenna element 41, if antenna element 41 is fixed in projection 31BW with an inclination in the upward and downward directions longitudinally, or if antenna connection member 42 is placed out of position against feeding point rand 35, flange portion 41B is almost surely connected electrically to pin 42C of antenna connection member 42.

Additionally, in wireless communication terminal 40, due to the use of pin-shaped telescopic antenna connection member 42 movable up,and down mentioned in FIGS. 13A and 13B, antenna connection member 42 can be made more compact than antenna connection member 37 (FIG. 6) produced of a plate spring of wireless communication terminal 30 (FIG. 6) in the aforementioned first mode of embodiment, thus making feeding point rand 35 and circuit board 33 to be connected more compact, as much as antenna. connection member 42 is made compact, resulting in the downsizing of wireless communication terminal 40 itself.

Constructed as described above, in wireless communication terminal 40, when assembled, with antenna element 41 supported in projection 31BW of case half, top 31B, a half of housing case 31, circuit board 33 is positioned against and fixed on other case half, bottom 31A in a way that antenna connection member 42 electrically and mechanically connected to feeding point rand 35 faces end face of flange portion 41B of antenna element 41.

Then, when fixing case half, top 31B on case half, bottom 31A in a overlapping way, the end face of flange portion 41B of antenna element 41 is electrically connected to feeding point rand 35 on circuit board 33 by means of antenna connection member 42.

Accordingly, in wireless communication terminal 40, because antenna element 41 is held in projection 31BW of case half, top 31B in advance, case half, top 31B can be as easily fixed on case half, bottom 31A as in wireless communication terminal 30 (FIG. 6) of the aforementioned first mode of embodiment.

Also when letting case half, bottom 31A hold circuit board 33, because circuit board 33 is positioned in order, assuming that antenna connection member 42 faces antenna element 41 supported by case half, top 31B, antenna element 41 can be easily connected electrically to feeding point rand 35 on circuit board 33 by mean is of antenna connection member 42 by merely mounting case half, top 31B on case half, bottom 31A.

Furthermore, in wireless communication terminal 40, because of the use of pin-shaped telescopic antenna connection member 42 smaller than antenna connection member 37 (FIG. 6) employed in wireless communication terminal 30 of the aforementioned first mode of embodiment to connect antenna element 41 and feeding point rand 35 on circuit board 33, circuit board 33 is made more compact as much, in turn downsizing wireless communication terminal 40.

For additional information, in wireless communication terminal 40, as in wireless communication terminal 30 of the aforementioned first mode of embodiment, due to the use of antenna connection member 42 installable on circuit board 33 with antenna element 41 supported by case half, top 31B, antenna connection member 42 can be installed on circuit board 33, together with other various circuit elements, with use of a given mounting machine, thus simplifying the installation work (of various components) on circuit board 33.

According to the above construction, with antenna element 41 held in projection 31BW of case half, top 31B, and telescopic pin-shaped antenna connection member 42 electrically and mechanically connected to feeding point rand 35 fixed on case half, bottom 31A in such a way as to let the circuit board, positioned in place, face the end face of flange portion 41B of antenna element 41, case half, top 31B can be put on case half, bottom 31A, so that, in addition to the effects obtained in the aforementioned first mode of embodiment, wireless communication terminal 40 can be made compact due to the employment of pin-shaped antenna connection member 42.

(3) Third Mode of Embodiment

Figure 17:
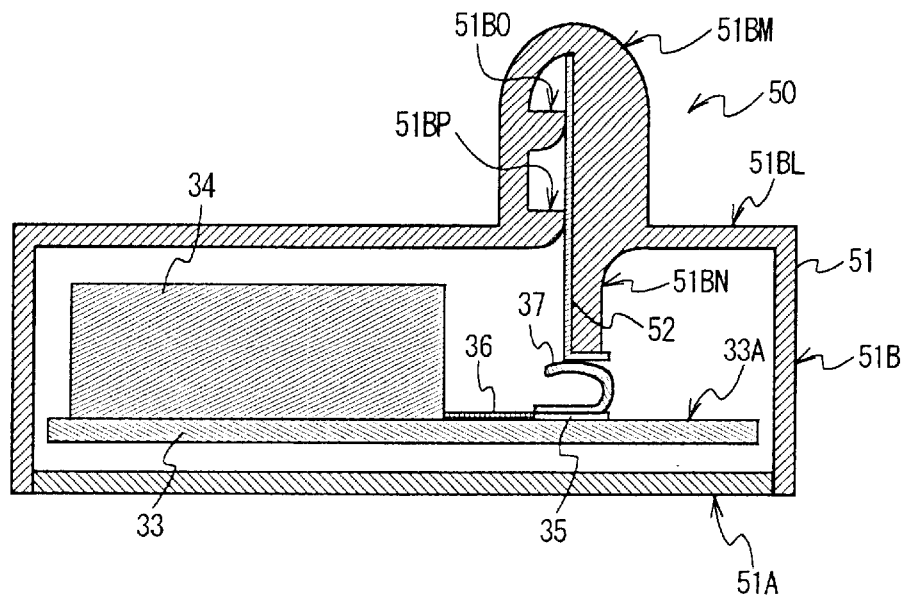
FIG. 17 is a schematic cross sectional view showing the architecture of a wireless communication terminal in a third embodiment.

FIG. 17 showing the same numeral references corresponding to those in FIG. 6 shows a wireless communication terminal 50 in a third mode of embodiment, which is constructed similarly to wireless communication terminal 30 (FIG. 6) in the aforementioned first mode of embodiment, except for the construction of a housing case 51 and an antenna element 52.

Housing case 51 consists of a case half, bottom 51A and case half, top 51B made of a nonconductive material, with a projection 51BM formed around an upper flat portion 51BL of case half, top 51A.

Formed inside projection 51BM of case half, top 51B is an antenna guide 51BN protruding into the inside of case half, top 51B and pressed onto antenna connection member 37, and inside antenna guide 51BN are two reduced portions 51BO and 51BP in a. narrower internal diameter in double deck.

And, in case half, top 51B, one half portion of antenna element 52 placed between antenna guide 51BN, and reduced portions 51BO and 51BP in a way that antenna element 52 runs along antenna guide 51BN of projection 51BM, with the crooked other end of antenna element 52 pressed to the bottom of antenna guide 51BN.

Figure 18:
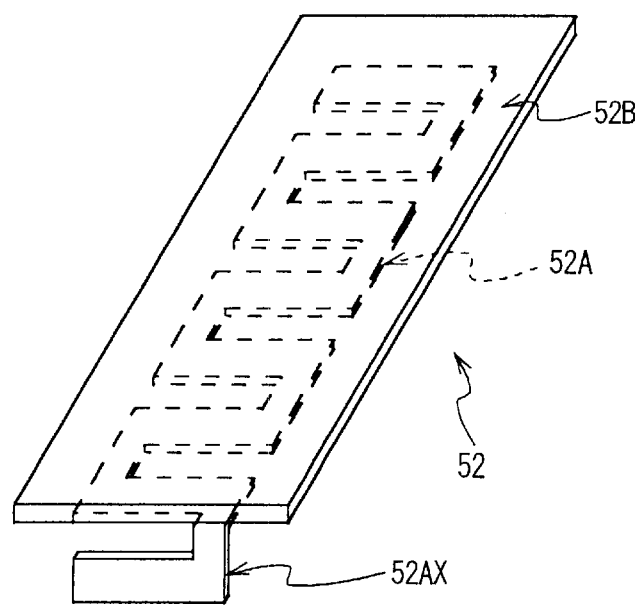
FIG. 18 is a schematic perspective view showing the architecture of an antenna element.

As shown in FIG. 18, antenna element 52 is structured in a double-tier laminate with a conductive foil 52A formed in a meandering shape and a sheet of nonconductive transparent film 52B. One end of conductive foil 52A is attached to antenna guide 51BN between antenna guide 51BN of projection 51BM and reduced portion 51B, and bent portion 52AX of the other end of conductive foil 52A to the bottom face of antenna guide 51BN.

With transparent film 52B pulled off bent portion 52AX of conductive foil 52A, and bent portion 52AX of conductive foil 52A directly pressed to antenna connection member 37 by the lower end of antenna guide 51BN, antenna element 52 is electrically connected to antenna connection member 37.

Thus, antenna element 52 is electrically connected to feeding point rand 35 on circuit board 33 by means of antenna connection member 37.

As is apparent from FIG. 18, such an antenna element 52 is so formed with meandering conductive foil 52A electrically specified to a predetermined electric length so that the layout space in the direction of height of case half, top 51B can be made substantially smaller compared to that of a bar-type antenna element with an equivalent electric length for example, thereby downsizing case half, top 51B in the direction of height (in particular, projection 51BM is substantially made smaller in the direction of height). As a result, wireless communication terminal 50 can be downsized to a great extent.

As is the case with wireless communication terminal 30 (FIG. 6) in the aforementioned first mode of embodiment, in wireless communication terminal 50 when assembled, circuit board 33 fixed with shield case 34 is positioned against and mounted on case half, bottom 51A with antenna element 52 held in projection 51BM of case half, top 51B in advance.

Then, with case half, top 51B fixed on case half, bottom 51A in an overlapping manner, bent portion 52AX of antenna element 52 is electrically connected to feeding point rand 35 by means of antenna connection member 37 installed on circuit board 33, thus competing the assembly of wireless communication terminal 50.

Constructed as described above, in wireless communication terminal 50, in assembling, with antenna element 52 having meandering conductive foil 52A supported in projection 51BM of case half, top 51B, a half of housing case 51, circuit board 33 is positioned against and fixed on the other case half, bottom 51A in a way that antenna connection member 37 electrically and mechanically connected to feeding point rand 35 faces bent portion 52AX of antenna element 52.

Then, when fixing case half, top 51B on case half, bottom 51A in an overlapping way with bent portion 52AX of antenna element 52 pressed onto antenna connection member 37 by means of antenna guide 51BN, conductive foil 52A of antenna element 52 is electrically connected to feeding point rand 35 on circuit board 33 by means of antenna connection member 37.

Accordingly, in wireless communication terminal 50, because antenna element 52 is held in projection 51BW of case half, top 51B in advance, case half, top 51B can be as easily fixed on case half, bottom 51A as in wireless communication terminal 30 (FIG. 6) of the aforementioned first mode of embodiment.

Also, prior to fixing case half, top 51B on case half, bottom 51A, because circuit board 33 is positioned against and fixed on case half, top 51A, with antenna connection member 37 electrically and mechanically connected to feeding point rand 35 on circuit board 33 facing bent portion 52AX of the other end of antenna element 52 supported in case half, top 51B, conductive foil 52A of antenna element 52 can be easily connected electrically to feeding point rand 35 on circuit board 33 by means of antenna connection member 37 by merely mounting the case half, top 51B on case half, bottom 51A.

Also, in wireless communication terminal 50, due to the employment of antenna element 52 having meandering conductive foil 52A, the layout space of antenna element 52 in the direction of height of case half, top 51B can be made smaller substantially, thereby downsizing case half, top 51B in the direction of height. As a result, a wireless communication terminal 50 can be downsized to a great extent.

According to the above construction, case half, top 51B is fixed on case half, bottom 51A with antenna element 52 having meandering conductive foil 52A held in projection 51BW of case half, top 51B, and circuit board 33 positioned against and mounted on case half, bottom 51A in such a way that antenna connection member 37 electrically and mechanically connected to feeding point rand 35 faces bent portion 52AX of the other end of antenna element 52. Consequently, the layout space of antenna element 52 can be markedly reduced as much as saved by the employment of antenna element 52 having meandering conductive foil 52A, in addition to the effects obtained in the aforementioned first mode of embodiment, resulting in the substantial downsizing of the wireless communication terminal 50.

(4) Other Modes of Embodiment

In the foregoing first and second modes of embodiment, elucidation is given on the case where a bar-type antenna element 32, 41 is adjusted to meet reduced portions 31BX and 31BY of projection 31BW of case half, top 31B in a penetrating manner. However, the present invention is not limited to it, but an antenna element formed with a kind of a given stopper at one end, or staged portions corresponding to reduced portions 31BX and 31BY can penetrate projection 31BW, which can prevent the antenna element from pulling out of projection 31BW, or from slipping out of position longitudinally.

Also, in the aforementioned first to third modes of embodiment, elucidation is given on the case where a matching circuit is placed between feeding point rand 35 on circuit board 33 and TR circuit. However, the present invention is not limited to it, but feeding point rand 35 can be electrically connected directly to TR circuit, removing the matching circuit.

Furthermore, in the aforementioned first to third modes of embodiment, elucidation is given on the case where antenna connection member 37, 42 is electrically and mechanically connected to feeding point rand 35 on circuit board 33 in advance. However, the present invention is not limited to it. For example, in a wireless communication terminal 55 shown in FIG. 19 designated with the identical reference numerals to those in FIG. 6, just like a pin-shaped antenna connection member 56 incorporating a coil spring (not shown in Fig.) electrically and mechanically connected to the other end of the antenna element in advance, antenna connection member 37, 42 can be electrically and mechanically connected to the other end of antenna element 32, 41, or 52 in advance, so that antenna element member 37, 42 can be electrically connected to feeding point rand 35 when putting case half, top 31B, 51B on case half, bottom 31A, 51A. In such a construction, too, the similar effects to those in the aforementioned first to third modes of embodiment can be obtained.

Figure 20:
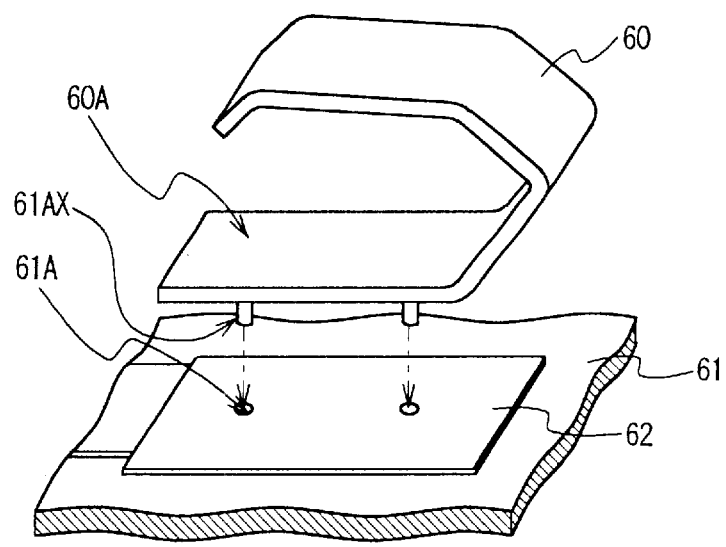
FIG. 20 is a schematic perspective view used in explaining the mounting of an antenna connection member in another embodiment.
Figure 21:
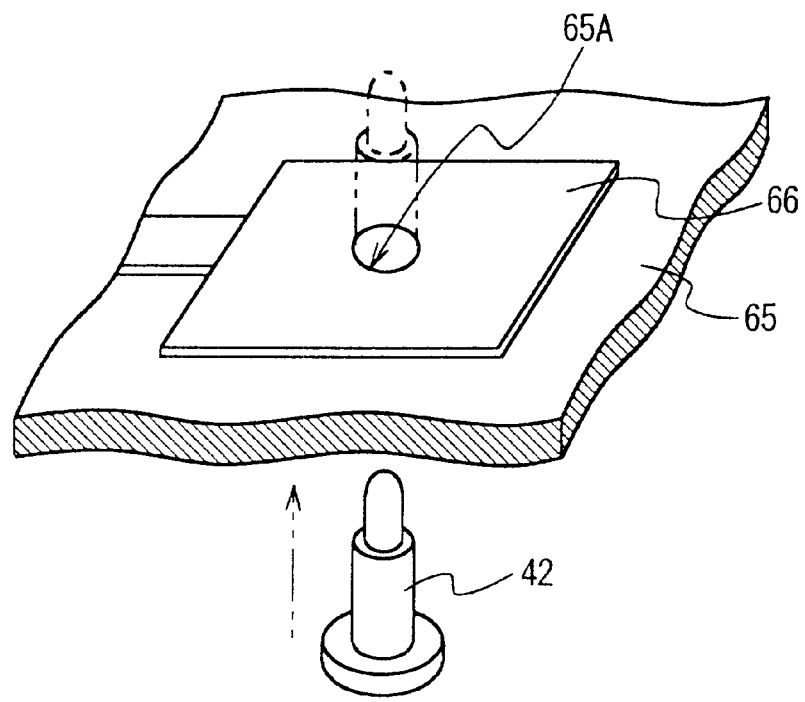
FIG. 21 is a schematic perspective view used in explaining the mounting of an antenna connection member in another mode of embodiment.

Furthermore, in the aforementioned first to third modes of embodiment, elucidation is given on the case where lower flat portion 37A or flange portion 42B of antenna connection members 37 or 42 respectively is electrically and mechanically connected to feeding point rand 35 on circuit board 33 by means of solder. However, the present invention is not limited to it, but, as shown in FIG. 20, feet 60AX can be formed beneath lower flat portion 60A of an antenna connection member 60 produced of a plate spring, and through holes 61A can be made on a circuit board 61 to engage with a feeding point rand 62 to install antenna connection member 60 on circuit board 61 by inserting feet 60AX of antenna connection member 60 into through holes 61A. As well, as shown in FIG. 21, a through hole 65A matching a pin-shaped antenna connection member 42 can be made on circuit board 65 to engage with a feeding point rand 66 to install antenna connection member 42 on circuit board 65 by inserting antenna connection member 42 into through hole 65A from beneath circuit board 65. In this way it is easy to position and install antenna connection member 60, 42 against and on circuit board 61, 65 with a reinforced connection.

Figure 22:
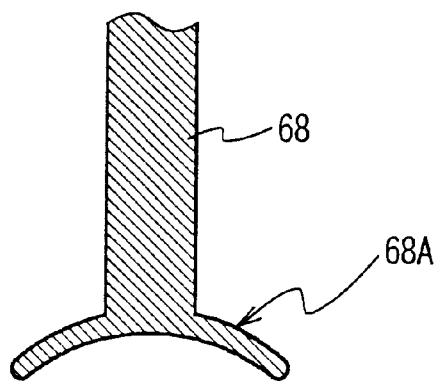
FIG. 22 is a schematic cross sectional view showing the architecture of an antenna element in another mode of embodiment.

Furthermore, in the foregoing second mode of embodiment, elucidation is given on the case where a flat flange portion 41B is formed around the other end of antenna element 41 as described referring to FIG. 16. However, the present invention is not limited to it, but a cone-shaped flange portion 68A can be formed around the other end of an antenna element 68 as shown in FIG. 22. For additional information, if a flat or cone-shaped flange portion is formed at the tip of the pin of a pin-shaped antenna connection member, an antenna element can be constructed easily by removing the flange portion at the other end.

Furthermore, in the foregoing third mode of embodiment, elucidation is given on the case where antenna element 52 of a double-tier construction laminated with conductive foil 52A and transparent sheet of film 52B is employed. However, the present invention is not limited to it, but an antenna element constructed in a triple-tier can be used in such a way that conductive foil can be sandwiched between two sheets of transparent film.

Figure 23:
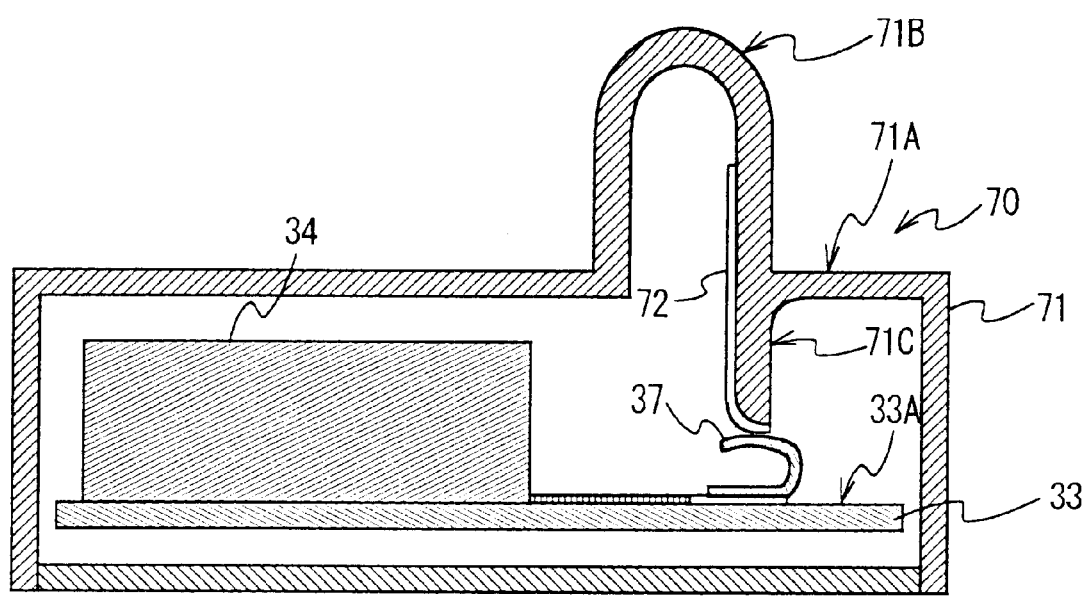
FIG. 23 is a schematic cross sectional view showing the architecture of a wireless communication terminal in another embodiment.

Also, in FIG. 23, where the parts corresponding to those in FIG. 17, are assigned the same reference numerals, as in a wireless communication terminal 70, a projection 71B can be formed on case half, top 71A of a housing case 71, and antenna guide 71C protruding from projection 71B into the inside of case half, top 71A so that antenna elements 72 can be formed in various shapes, linear or meandering, by means of plating or vapor coating over the end face of antenna guide 71C from the inside of projection 71B.

The formation of such an antenna element 72, as in wireless communication terminal 70, can obviate the need for special antenna element supports such as reduced portions to hold an antenna element, simplifying construction of case half, top 71A of housing case 71. For additional information, in such a wireless communication terminal 70, forming the plane in an arc, from the side to the end of antenna guide 71C, can prevent antenna element 72 formed by means of plating or vaporizing from coming off or being broken at that area.

Furthermore, in the foregoing first to third modes of embodiment, elucidation is given on the case where the present invention is applicable to the aforementioned wireless communication terminals 30, 40 and 50 shown in FIGS. 6, 11, and 12. However, the present invention is not limited to it, but can be applied widely to antenna devices and wireless communication terminals used in a variety of other uses as long as they have an antenna element housed inside the housing case.

Furthermore, in the foregoing first to third modes of embodiment, elucidation is given on the case where antenna elements 32, 41 made of a bar-type conductive member mentioned in FIGS. 6, 11, and antenna element 52 having meandering conductive foil 52A described in FIG. 17, are used as antenna elements. However, the present invention is not limited to them, but can be applied widely to a variety of other antenna elements, such as helical antennas formed by winding conductive wire helically, or antenna elements of which surfaces are processed by, for example, plating to prevent the surfaces, of a conductive or nonconductive material, from oxidizing, and to improve their electric characteristics, or antenna elements having conductive foil formed into a variety of other shapes than a meandering pattern.

Furthermore, in the foregoing first to third modes of embodiment, elucidation is given on the case where case half, top 31B, 51B with projection 31BW, 51BM made of a nonconductive electrical material is applied as an antenna support means for supporting an antenna element. However, the present invention is not limited to it, but can be applied widely to a variety of other antenna support means, such as projections capable of matching and engaging with case half, top 31B, 51B.

Furthermore, in the foregoing modes of embodiments, elucidation is given on the case where circuit board 33 installed with various circuit elements is applied as a circuit board formed with an electrode to supply power to an antenna element. However, the present invention is not limited to it, but can be applied widely to a variety of other circuit boards capable of forming an electrode to supply power to an antenna element.

Furthermore, in the foregoing modes of embodiments, elucidation is given on the case where case half, bottom 31A, 51A made of a nonconductive material is applied as a board support means for supporting a circuit board. However, the present invention is not limited to it, but can be applied widely to a variety of other board support means such as a case half, bottom made of a conductive material as long as they can support a circuit board.

Furthermore, in the foregoing modes of embodiments, elucidation is given on the case where antenna connection member 37 produced of a plate spring and a pin-shaped telescopic antenna connection member 42 is applied as connection means having resilience for electrically connecting an antenna element and the electrode of a circuit board by fixing antenna support means on board support means. However, the present invention is not limited to the above, but a wide variety of other connection means can be applied, such as a rubber connector produced of an insulating rubber material with a plurality of wires inserted into one another longitudinally in parallel at a given pitch.

According to the present invention hitherto described, with an antenna element held in an antenna support member, and a circuit board formed with an electrode to supply power to an antenna element held on a circuit support member, and with the antenna element electrically connected to the electrode of a circuit board by means of a connection member having resilience by fixing an antenna support member on the board support member, because the antenna element is held in the antenna support member in advance, the antenna support member can be easily fixed on the board support member, and concurrently enabling the antenna element to be connected electrically to the electrode of the circuit board via the connection member by merely fixing the antenna support member on the board support member, thus substantially enhancing the assemblage of antenna devices and wireless communication terminals.

While there has been described in connection with the preferred embodiments of the invention, it will be obvious to those skilled in the art that various changes and modifications may be aimed, therefore, to cover in the appended claims all such changes and modifications as fall within the true spirit and scope of the invention.

What is claimed is:

1. An antenna device, comprising:
   an antenna holding member for holding an antenna element;
   a circuit board formed with an electrode for supplying power to said antenna element;
   a board holding member for holding said circuit board; and
   a connection member having a resilient portion for electrically connecting said antenna element and said electrode of said circuit board by securing said antenna holding member on said board holding member, whereby said antenna holding member includes means for holding said antenna element such that said antenna element directly contacts said resilient portion of said connection member and wherein said holding means extend inwardly from a projection which covers said antenna element.

2. The antenna device according to claim 1 wherein said connecting member is produced of a plate spring.

3. The antenna device according to claim 1 wherein said connection member is produced of a pin-shaped telescopic connection member.

4. The antenna device according to claim 1 wherein said connection member is electrically and mechanically connected to said electrode in advance, and installed on said circuit board.

5. The antenna device according to claim 1 wherein said connection member is electrically and mechanically connected to said antenna element in advance.

6. The antenna device according to claim 1 wherein said antenna element is produced of conductive foil formed in a given shape.

7. The antenna device according to claim 6 wherein said antenna element is formed on said antenna holding member by plating or by vapor coating.

8. An assembly method for an antenna device, comprising the steps of:
   holding an antenna element in an antenna holding member, and holding a circuit board formed with an electrode to supply power to said antenna element on a board holding member;
   electrically connecting said antenna member and said electrode of said circuit board by means of a connection member having a resilient portion by securing said antenna holding member on said board holding member;
   directly contacting said resilient portion of said connection member with said antenna element by securement means of said antenna holding member holding said antenna element; and
   extending said securement means inwardly from a projection which covers said antenna element.

9. The assembly method for an antenna device according to claim 8 wherein said antenna element and said electrode of said circuit board are electrically connected by means of said connection member produced of a plate spring.

10. The assembly method for an antenna device according to claim 8 wherein said antenna element and said electrode of said circuit board are electrically connected by means of said connection member produced of a pin-shaped telescopic connection member.

11. The assembly method for an antenna device according to claim 8 wherein said connection member is electrically and mechanically connected to said electrode in advance, and installed on said circuit board.

12. The assembly method for an antenna device according to claim 8 wherein said connection member is connected electrically and mechanically to said antenna element in advance.

13. The assembly method for an antenna device according to claim 8 wherein said antenna element made of conductive foil formed into a given shape is held on said antenna holding member.

14. The assembly method for an antenna device according to claim 13 wherein said antenna element is formed on said antenna holding member by means of plating or vapor coating.

15. A wireless communication terminal to transmit and/or receive given data, comprising:

an antenna element to transmit and/or receive said data;

an antenna holding member for holding said antenna element;

a circuit element for transmitting and/or receiving to perform a given transmitting and/or receiving process to said data, and a circuit board formed with an electrode electrically connected to said circuit element to supply power to said antenna element;

a board holding member for holding said circuit board; and a connection member having a resilient portion for electrically connecting said antenna element and said electrode of said circuit board by securing said antenna holding member on said board holding member, whereby said antenna holding member includes means for holding said antenna element such that said antenna element directly contacts said resilient portion of said connection member and wherein said holding means extend inwardly from a projection which covers said antenna element.

16. The wireless communication terminal according to claim 15 wherein said connection member is produced of a plate spring.

17. The wireless communication terminal according to claim 15 wherein said connection member is produced of a pin-shaped telescopic connection member.

18. The wireless communication terminal according to claim 15 wherein said connection member, electrically and mechanically connected to said electrode in advance, is installed on said circuit board.

19. The wireless communication terminal according to claim 15 wherein said connection member is electrically and mechanically connected to said antenna element in advance.

20. The wireless communication terminal according to claim 15 wherein said antenna element is made of conductive foil formed into a given shape.

21. The wireless communication terminal according to claim 20 wherein said antenna element is formed on said antenna holding member by means of plating or vapor coating.

22. The wireless communication terminal according to claim 15 wherein said antenna holding member is formed of one of a pair of case halves forming a case to house said circuit board and said antenna element, and said board holding member is formed on the other half of said pair of case halves.

23. An assembly method for a wireless communication terminal to transmit and/or receive given data, said method comprising the steps of:

holding an antenna element to transmit and/or receive said data to/from an antenna holding member, and installing a transmitting/receiving circuit element on a board holding member to perform a transmitting and/or receiving process to said data, and holding a circuit board formed with an electrode electrically connected to said circuit element to supply power to said antenna element;

electrically connecting said antenna element and said electrode of said circuit board by means of a connecting member having a resilient portion by securing said antenna holding member on said board holding member;

directly contacting said resilient portion of said connection member with said antenna element by securement means of said antenna holding member holding said antenna element; and extending said securement means inwardly from a projection which covers said antenna element.

24. The assembly method for an antenna device according to claim 23 wherein said antenna element and said electrode of said circuit board are electrically connected by means of said connection member produced of a plate spring.

25. The assembly method for an antenna device according to claim 23 wherein said antenna element and said electrode of said circuit board are electrically connected by means of said connection member which is telescopic and pin-shaped.

26. The assembly method for an antenna device according to claim 23 wherein said connection member, electrically and mechanically connected to said electrode in advance, is installed on said circuit board.

27. The assembly method for an antenna device of according to 23 wherein said connection member is electrically and mechanically connected to said antenna element in advance.

28. The assembly method for an antenna device according to claim 23 wherein said antenna element produced of conductive foil formed into a given shape is held on said antenna holding member.

29. The assembly method for an antenna device according to claim 28 wherein said antenna element is formed on said antenna holding member by means of plating or vapor coating.

30. The assembly method for an antenna device according to claim 23 wherein said antenna element is held in said antenna holding member produced of one of a couple of case halves forming a housing case to house said circuit board and said antenna element, and wherein said circuit board is held on said board holding member produced of the other case half of said couple of case halves.

31. A wireless communication terminal to transmit and/or receive given data, comprising:

an antenna element to transmit and/or receive said data;

an antenna holding member for holding said antenna element;

a circuit element for transmitting and/or receiving to perform a given transmitting and/or receiving process to said data, and a circuit board formed with an electrode electrically connected to said circuit element to supply power to said antenna element;

a board holding member for holding said circuit board;

a connection member having a resilient portion for electrically connecting said antenna element and said electrode of said circuit board by securing said antenna holding member on said board holding member, whereby said antenna holding member includes means for holding said antenna element such that said antenna element directly contacts said resilient portion of said connection member; and wherein said antenna holding member is formed of one of a pair of case halves forming a case to house said circuit board and said antenna element, and said board holding member is formed on the other half of said pair of case halves.

32. An assembly method for a wireless communication terminal to transmit and/or receive given data, said method comprising the steps of:

holding an antenna element to transmit and/or receive data to/from an antenna holding member, and installing a transmitting/receiving circuit element on a board holding member to perform a transmitting and/or receiving process to said data, and holding a circuit board formed with an electrode electrically connected to said circuit element to supply power to said antenna element;

electrically connecting said antenna element and said electrode of said circuit board by means of a connecting member having a resilient portion by securing said antenna holding member on said board holding member;

directly contacting said resilient portion of said connection member with said antenna element by securement means of said antenna holding member holding said antenna element; and wherein said antenna element is held in said antenna holding member produced of one of a couple of case halves forming a housing case to house said circuit board and said antenna element, and wherein said circuit board is held on said board holding member produced of the other case half of said couple of case halves.

* * * * *